United States Patent [19]
Sun et al.

[11] Patent Number: 6,124,217
[45] Date of Patent: Sep. 26, 2000

[54] IN-SITU SION DEPOSITION/BAKE/TEOS DEPOSITION PROCESS FOR REDUCTION OF DEFECTS IN INTERLEVEL DIELECTRIC FOR INTEGRATED CIRCUIT INTERCONNECTS

[75] Inventors: Sey-Ping Sun, Austin; Mark I. Gardner, Cedar Creek, both of Tex.; Minh Van Ngo, Fremont, Calif.

[73] Assignee: Advanced Micro Devices, Inc., Sunnyvale, Calif.

[21] Appl. No.: 09/200,016

[22] Filed: Nov. 25, 1998

[51] Int. Cl.[7] .................................................... H01L 21/31
[52] U.S. Cl. .......................... 438/778; 438/786; 438/787; 438/624; 438/339; 438/595
[58] Field of Search ................................. 438/778, 786, 438/787, 339, 595

[56] References Cited

U.S. PATENT DOCUMENTS

| | | | |
|---|---|---|---|
| 4,619,034 | 10/1986 | Janning | 29/571 |
| 4,872,947 | 10/1989 | Wang et al. | 156/643 |
| 5,071,790 | 12/1991 | Kim | 437/195 |
| 5,413,940 | 5/1995 | Lin et al. | 437/7 |
| 5,563,102 | 10/1996 | Michael | 437/209 |
| 5,648,287 | 7/1997 | Tsai et al. | 437/44 |
| 5,818,092 | 10/1998 | Bai et al. | 257/388 |
| 5,953,619 | 9/1999 | Miyazawa et al. | 438/396 |
| 5,972,804 | 10/1999 | Tobin et al. | 438/786 |
| 5,998,270 | 12/1999 | Gilmer et al. | 438/287 |

FOREIGN PATENT DOCUMENTS

| | | |
|---|---|---|
| 64-19760 | 1/1989 | Japan . |
| 87/07309 | 12/1987 | WIPO . |
| 97/18585 | 5/1997 | WIPO . |

OTHER PUBLICATIONS

Wolf, Stanley "Silicon Processing For the VLSI Era—vol. 2—Process Integration", USPTO Library, p. 198, 1990.
Patent Abstracts of Japan, Publication No. 01019760, Publication Date Jan. 23, 1989.
Rao et al., "Optimization of PECVD Silicon Oxynitride for Silicon MIS Devices with Low Interface State Density," Solid–State Electronics, vol. 39, No. 12, Dec. 1996, pp. 1808–1810.
International Search Report for Application No. PCT/US99//13575, mailed Sep. 22, 1999.

*Primary Examiner*—Matthew Smith
*Assistant Examiner*—Renzo N. Rocchegiani
*Attorney, Agent, or Firm*—Kevin L. Daffer; Conley, Rose & Tayon

[57] ABSTRACT

An interlevel dielectric including a tetraethyl orthosilicate (TEOS) oxide and a silicon oxynitride (SiON) etch stop layer is formed for use in integrated circuit fabrication. A SiON layer is deposited onto a semiconductor substrate which may include transistors and/or interconnect levels. The SiON layer is heated before deposition of the TEOS layer. Heating of the SiON layer greatly reduces the number of defects formed during the TEOS deposition. A highly conformal, high-quality interlevel dielectric is thereby formed.

18 Claims, 4 Drawing Sheets

IN-SITU SION DEPOSITION/BAKE/TEOS DEPOSITION PROCESS FOR REDUCTION OF DEFECTS IN INTERLEVEL DIELECTRIC FOR INTEGRATED CIRCUIT INTERCONNECTS

BACKGROUND OF THE INVENTION

1. Field of the Invention

This invention relates to integrated circuit fabrication, and more particularly to an in-situ process for interlevel dielectric formation.

2. Description of the Relevant Art

Fabrication of a metal-oxide-semiconductor (MOS) integrated circuit involves numerous processing steps. Typically, a gate oxide is formed on a semiconductor substrate which is doped with either n-type or p-type impurities. For each transistor being formed, a gate conductor is formed over the gate oxide, and dopant impurities are introduced into the substrate to form source and drain regions. Dielectric spacers may be formed on the sidewalls of the gate conductor, and may aid in the formation of lightly-doped drain (LDD) portions of the source/drain regions. Dielectric spacers may also isolate the gate from the source/drain regions so that a self-aligned silicide, or salicide, process may be performed on the transistor. A salicide process is often used to form lower-resistance contacts to the transistor source, drain and gate regions by providing a metal silicide layer on upper surfaces of these doped silicon regions.

After transistor fabrication, interconnect structures are required to connect the transistors to form a circuit. Interconnects are patterned from conductive layers which are isolated from the transistors and other interconnect layers by dielectric layers. In the high-density integrated circuits currently being fabricated, more than one interconnect level is typically needed. Interconnects which contact the transistor gate, source and/or drain directly, or which extend between closely spaced contact areas are called "local interconnects". Local interconnects are typically used for making connections between gate, source and/or drain regions of neighboring transistors, and are located in the interconnect level closest to the substrate. Because of their relatively short lengths, low resistivity is less critical, and local interconnects may be formed from higher-resistivity metals such as tungsten, or from doped polysilicon and metal silicides. Interconnects which travel longer distances across the circuit are called "global interconnects". Global interconnects are formed in layers further above the substrate than are local interconnects, and are typically formed from low-resistivity metals such as aluminum or, more recently, copper.

Interconnect formation puts several constraints on the interlevel dielectrics which separate interconnect levels. Because interconnects are formed after source/drain impurity distributions are introduced, relatively low interconnect formation temperatures are needed so that dopant redistribution is minimized. In the case of the interconnect level closest to the substrate (typically a local interconnect level), the interlevel dielectric underlying the interconnect level is in contact with portions of the transistors. In this case, it is particularly important that defects in the dielectric which may interact with a transistor to cause hot carrier effects and/or threshold voltage shifts be minimized. These two requirements, low formation temperature and low defect densities, may be in conflict. For example, plasma-enhanced chemical vapor deposition (PECVD) of dielectric layers allows low-temperature deposition (typically about 400° C. or less), but can also result in excess hydrogen incorporation in dielectrics such as silicon dioxide ("oxide") and silicon nitride ("nitride"). Hydrogen in dielectrics is believed to contribute to hot-electron effects in transistors by increasing the density of available trap states which can be occupied by hot electrons injected into a dielectric. Hydrogen diffuses rapidly in oxide, and so can diffuse to Si/oxide interfaces near the transistor channel, where it may disrupt the pre-existing bonds. Although dangling bonds may be terminated with Si—H bond formation, Si—H bonds are weak and can easily be broken by injected hot electrons. In this way, hydrogen may exacerbate hot-electron effects.

Another desired characteristic for interlevel dielectrics used in interconnect formation is conformality, such that film thickness is equal over all substrate topography. Conformal interlevel dielectrics ensure that an adequate insulator thickness exists under each interconnect conductor for its entire path across the circuit, and minimize the possibility of, for example, void formation in dielectric layers going over steps. In order to maintain adequate insulator thicknesses over higher-lying features even after planarization of a dielectric, interlevel dielectric layers are often made relatively thick (a micron or more). In order to etch via holes through these thick layers to form contacts to the underlying devices or interconnects, a rapid etch process is used. Because etches for dielectrics are generally not perfectly selective over silicon, an etch stop layer may be needed between the substrate and the overlying interlevel dielectric. In this case, it follows that an additional requirement is compatibility between the etch stop and interlevel dielectric layers. Furthermore, it would be desirable that deposition times for the interlevel dielectric and etch stop layers be as short as possible.

It would therefore be of benefit to develop a method for forming a conformal interlevel dielectric for interconnect formation during integrated circuit fabrication. An etch stop layer should be included to prevent overetching of the underlying transistors. The interlevel dielectric should be formed at low temperatures so that redistribution of dopants in the transistors is avoided. The dielectric should also have low hydrogen content, and deposition times should be short.

SUMMARY OF THE INVENTION

The requirements described above are in large part addressed by a process employing an oxide layer formed from tetraethyl orthosilicate (TEOS), a silicon oxynitride (SiON) etch stop layer, and a bake of the SiON layer before deposition of the TEOS. A transistor, including a gate dielectric, gate conductor, and source and drain regions, may be fabricated on a semiconductor substrate. The transistor may also include dielectric sidewall spacers and silicide gate, source and/or drain contact regions. The SiON layer may be subsequently deposited by PECVD at about 400° C., using silane, $N_2$, and $N_2O$ as precursors. The SiON layer is preferably from about 500 angstroms to about 1000 angstroms thick. The bake of the SiON layer is preferably performed in a chamber linked by one or more valves to the SiON and TEOS deposition chambers, so that the substrate is not exposed to room air between the SiON and TEOS depositions. Room air exposure could cause particulate contamination and/or unwanted oxidation. The bake may be performed in an inert gas ambient at a temperature in the range from about 380° C. to 410° C. and for a time in the range from about 30 seconds to about 1 minute. For the TEOS deposition, TEOS may be decomposed in a plasma-enhanced CVD (PECVD) reactor at a substrate temperature of about 400° C. The TEOS layer may be from about 0.5 micron to about 2 microns thick. Contacts may subsequently be formed through the combined TEOS/SiON dielectric for contacts to the transistor and local interconnect formation.

TEOS deposition is believed to allow deposition of a very conformal dielectric at a low temperature of about 400° C. The nitrogen in the SiON layer may cause it to be etched more slowly than the TEOS during etching of, for example, a contact hole. Although nitride may be even more effective as an etch stop layer, use of a nitride layer is believed to result in more severe hot-carrier effects during operation of underlying transistors.

The bake of the SiON layer is believed to reduce the density of defects appearing on the TEOS surface after deposition of TEOS over the SiON. A problem which arises with the TEOS/SiON layered dielectric is that a high density (up to tens of thousands per $cm^2$) of small (less than about 0.2 micron in diameter) bubble-shaped ("bubble") defects appears during deposition of the TEOS over the SiON layer. These defects are believed to be caused by outgassing from the SiON film. Even if the defects do not affect the performance of the finished device, such large defect densities are a hindrance to the use of automated wafer inspection systems during wafer fabrication. Automated wafer inspection systems, such as those manufactured by KLA-Tencor, are now widely used in the semiconductor manufacturing industry for detection of manufacturing defects, particularly particles and structural defects. These systems employ various illumination and image processing techniques, such as laser reflection from unpatterned wafers or subtraction of images from repeated structures on a patterned wafer (die-to-die comparison). Output generated by KLA-Tencor wafer inspection systems typically includes a defect map of a wafer, containing information on the size and location of defects present. Such information on manufacturing defects can be crucial when identifying and solving quality control problems which arise during complex semiconductor manufacturing processes. The numerous TEOS bubble defects described above may inhibit this quality control process by masking the presence of other defects. In addition to this interference with the operation of automated wafer inspection systems, the bubble defects may be detrimental to circuit performance. For example, the defects may affect the integrity of the TEOS/SiON interlevel dielectric, increasing the likelihood of charge leakage through the dielectric. Furthermore, the defects may increase the likelihood of charge trapping in the dielectric in the vicinity of the transistor. Such charge trapping could cause threshold voltage shifts.

The SiON and TEOS depositions described above are typically performed in chemical vapor deposition (CVD) chambers associated with "cluster tools" used in the semiconductor industry. Cluster tools include chambers grouped together so that multiple deposition, etching, or other processes can be performed sequentially without exposing substrates to room air between the processes. The CVD chambers often have multiple (for example, six) substrate mounting positions. A substrate is moved sequentially into different positions during a deposition such that a portion of the deposition takes place with the substrate in each of the mounting positions in the chamber. For example, a substrate may be loaded into the first substrate position of the chamber, after which one-sixth of the deposition is performed. The substrate is then moved to the second substrate position, while a second substrate is brought into the chamber and loaded into the first position. Another one-sixth of a deposition is performed, and the process continues with movement of the two substrates into adjacent positions and entry of a third substrate into the chamber. This type of system is designed to improve the uniformity of a deposited layer across the substrate by averaging out random process variations which are chamber-location dependent, in addition to increasing throughput by allowing overlapping deposition sequences for multiple substrates. Subsequent to complete deposition of the SiON layer (all six portions, in this case), a substrate may be moved to a separate, but preferably connected, chamber for the bake as described above. Subsequent to the bake, the substrate may be moved to a deposition chamber for TEOS deposition. In a similar manner as for the SiON deposition, the TEOS deposition is typically performed in portions such that a portion of the layer is deposited with the substrate in each of multiple mounting positions within the chamber. A TEOS film having a greatly reduced density of bubble defects may thereby be formed.

In addition to reducing the density of TEOS bubble defects, the process recited herein is believed to result in a lower cycle time, or time needed for fabrication of an integrated circuit on a substrate, as compared to a process without the in-situ bake recited herein. Use of an in-situ bake after the SiON deposition allows shorter temperature soak times to be used during the TEOS deposition. The temperature soak time is the time needed to stabilize the substrate temperature before the deposition portion performed at each substrate position in the deposition chamber. A soak time of 45 seconds is typically needed for the TEOS deposition, while 10 seconds or less is sufficient for the deposition with the bake module. In the deposition chamber configuration described above, however, a new substrate enters the chamber before every partial deposition. The temperature soak time for all of the substrates must therefore always be as long as that needed for the new substrate in the chamber, so that the same soak time is used for each portion of the deposition on a given substrate. In this case, deposition in a chamber with six mounting positions requires 6×45 seconds, or 4.5 minutes, per deposition for temperature soaking.

It can be seen from the above discussion that reducing the temperature soak time of the first portion of the deposition could reduce the total deposition time significantly. Inclusion of the in-situ bake recited herein before the TEOS deposition is believed to maintain the substrate at a temperature near the TEOS deposition temperature. Therefore, a reduced temperature soak time of about 10 seconds at each position in the chamber, or one minute for the entire deposition, is believed to be sufficient for TEOS depositions performed after the in-situ bake recited herein. As compared to the typical soak time of about 45 seconds, as described above, when the in-situ bake is not used, the process recited herein may save about 3.5 minutes per TEOS deposition per substrate.

An alternative approach to baking the SiON layer after deposition is to increase temperature soak times during deposition of the SiON layer, as a way of baking the SiON layer during its deposition. This technique, however, has been found to be less effective at reducing the density of TEOS bubble defects, in addition to being more time-consuming. This may indicate that the uppermost portion of the SiON layer is the primary source of the TEOS bubble defects. The process recited herein may therefore further shorten the cycle time by allowing shorter temperature soak times during the SiON deposition as well as the TEOS deposition.

Another alternative approach is to raise the temperature of the SiON deposition to about 450° C. This has been found to lower the density of bubble defects in subsequently deposited TEOS layers. However, hot-electron effects during operation of underlying transistors have also been found to be more severe when this higher SiON deposition temperature is used. It is postulated that the increased deposition temperature alters the balance of the chemical processes occurring during the deposition. This altered balance appears to inhibit incorporation into the film of chemical species which may outgas during TEOS deposition to cause bubble defects. However, other species, such as hydrogen, which may contribute to hot-carrier effects in transistors appear to be either incorporated in larger amounts or in such a way that they have a greater effect on transistor operation.

BRIEF DESCRIPTION OF THE DRAWINGS

Other objects and advantages of the invention will become apparent upon reading the following detailed description and upon reference to the accompanying drawings in which.

Figure 1:
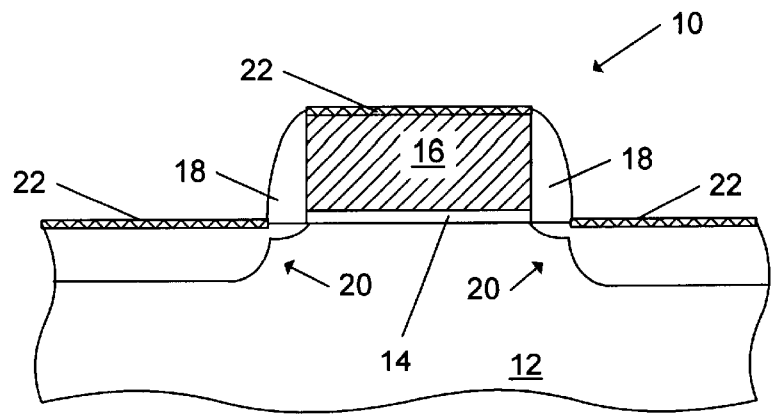
FIG. 1 is a partial cross-sectional view of a semiconductor topography including a semiconductor substrate upon which a transistor is formed, wherein the transistor includes a gate structure having a gate conductor and a pair of dielectric sidewall spacers, a gate dielectric, source and drain impurity distributions self-aligned both to the gate conductor and to the sidewall spacers, and silicide regions on upper surfaces of the source, drain, and gate conductor.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed. On the contrary, the intention is to cover all modifications, equivalents, and alternatives falling within the spirit and scope of the present invention.

DETAILED DESCRIPTION OF THE PREFERRED EMBODIMENTS

Turning to the drawings, FIG. 1 illustrates a partial cross-section of a transistor 10 including a gate conductor 16 and a gate dielectric 14 arranged above semiconductor substrate 12. Dielectric spacers 18 are formed adjacent to gate conductor 16. Source and drain regions 20 may be formed using a lightly-doped impurity distribution self-aligned to gate conductor 16 and a heavily-doped impurity distribution self-aligned to lateral surfaces of spacers 18. Following the formation of source and drain regions 20, a salicide process may be performed in a manner well-known in the art to form silicides 22 on upper surfaces of source and drain regions 20 and gate conductor 16. Formation of spacers 18 may be advantageous for reasons including the ability to form lightly-doped regions under the spacers which may lower the maximum electric field developed at the drain end of the channel. This lowered electric field may reduce the severity of hot-carrier effects such as avalanche breakdown at the drain/substrate junction and injection of carriers into the gate dielectric. Spacers 18 may also be advantageous by providing isolation between the source/drain and gate regions so that a salicide process may be performed.

Semiconductor substrate 12 is preferably monocrystalline silicon, and is doped either n-type or p-type. More specifically, substrate 12 may be an epitaxial silicon layer grown on a monocrystalline silicon substrate, or an n-type or p-type well region formed in a monocrystalline silicon substrate. Although not shown, dielectric isolation regions may be formed in substrate 12 which separate transistor 10 from adjacent transistors. One method by which such isolation regions may be formed is the formation of trenches which are subsequently filled with a deposited dielectric, while another method which may be used is local oxidation of the substrate, using silicon nitride to mask the active regions in which transistors are to be formed. Gate dielectric 14 is preferably grown by heating substrate 12 to a temperature of greater than about 700° C. in an oxidizing ambient to grow silicon dioxide. Other gate dielectrics may be used, however, including silicon nitride, nitrided silicon dioxide, silicon oxynitride, and deposited silicon dioxide. Gate conductor 16 is preferably a polysilicon gate conductor patterned from a polysilicon layer which is deposited using chemical vapor deposition (CVD) of silicon from, for example, a silane source. Such a CVD process may alternatively result in an amorphous silicon layer, particularly if low substrate temperatures (less than 580 degrees C) are used. An amorphous silicon layer may also be patterned to form gate conductor 16, and other materials which can withstand subsequent processing (such as that needed to form source and drain regions) may also be used.

The impurity distributions forming source and drain regions 20 are preferably introduced using ion implantation, and are of opposite type to that of substrate 12. For an n-channel transistor, for example, substrate 12 is p-type and source and drain regions 20 are n-type. Typical n-type dopants include arsenic and phosphorus, while boron is a typical p-type dopant. If source and drain regions 20 are introduced by ion implantation, a subsequent anneal is performed in order to activate the impurities and repair damage to substrate 12. Spacers 18 are typically silicon dioxide, formed by CVD of a conformal silicon dioxide layer and anisotropic etching of the layer to form spacers. Spacers 18 may also be formed from other dielectrics such as silicon nitride or silicon oxynitride. Silicides 22 are typically titanium silicide or cobalt silicide, but may also be formed using other metals including tantalum, nickel, tungsten, molybdenum, and platinum.

Figure 2:
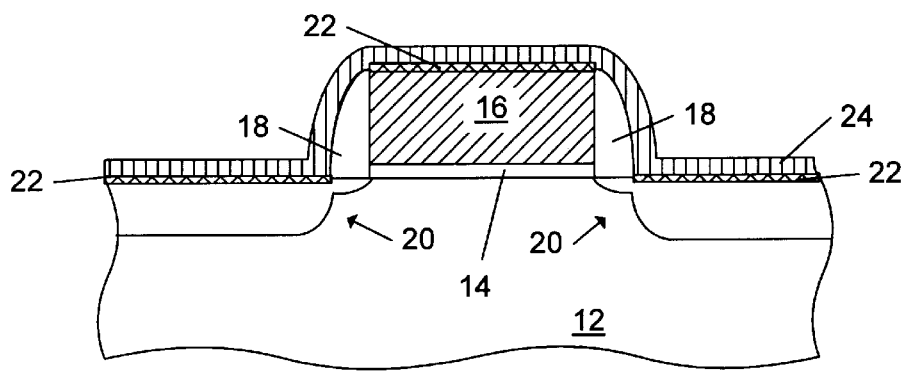
FIG. 2 is a partial cross-sectional view of the semiconductor topography wherein a silicon oxynitride layer is deposited over the transistor, subsequent to the transistor formation of FIG. 1.

SiON layer 24 is subsequently deposited over transistor 10, as shown in FIG. 2. The SiON may be deposited by PECVD using silane, $N_2$, and $N_2O$ reactant gases. In this case, a preferred deposition temperature is about 400° C., but may range from about 200° C. to about 500° C. The SiON layer is preferably about 800 angstroms thick, but may have thickness ranging from about 400 angstroms to about 2000 angstroms. Other reactant gases may also be used; for example, $N_3$ could be used instead of $N_2$. In addition, the SiON could be grown using other techniques, such as atmospheric-pressure CVD (APCVD), LPCVD or room temperature CVD (RTCVD). The precise composition of the SiON film depends on deposition conditions such as the relative flow rates of the reactant gases, such that more oxygen-rich or more nitrogen rich films may be formed. Although a higher nitrogen content is believed to increase the effectiveness of the SiON film as an etch stop for the overlying TEOS layer, more nitrogen-rich films grown by PECVD are also believed to result in more severe hot-carrier effects during operation of underlying transistors. SiON films having a higher nitrogen content may incorporate more hydrogen during PECVD deposition than those having a lower nitrogen content.

Figure 3:
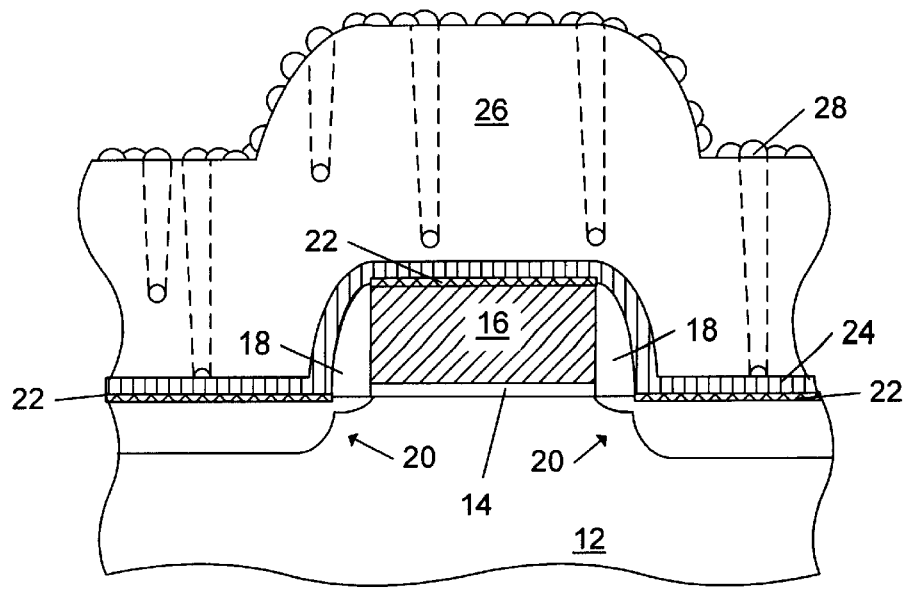
FIG. 3 is a partial cross-sectional view of the semiconductor topography wherein a TEOS layer is deposited over the silicon oxynitride layer, and wherein multiple bubble and/or void defects are formed within the TEOS layer, subsequent to the silicon oxynitride deposition of FIG. 2.

TEOS layer 26 may then be deposited over SiON layer 24, as shown in FIG. 3. In particular, decomposition of tetraethyl orthosilicate (TEOS) may be performed in a PECVD reactor at a substrate temperature in the range from about 200° C. to 500° C. to produce a very conformal film. Alternatively, TEOS layer 26 may be formed by other methods including low-pressure CVD (LPCVD) at a substrate temperature in the range from about 300° C. to about 800° C. In a preferred embodiment, the TEOS is deposited at about 400° C., and has a thickness of about 1.2 microns. TEOS layer 26 could also have a thickness in a range from about 0.5 micron to about 2 microns. A high density of bubble defects 28 is formed within the surface of TEOS layer 26 as a result of outgassing from the underlying SiON. Each defect 28 is approximately 0.2 micron in diameter or less for a TEOS thickness of about 1.2 microns. Thicker TEOS films grown over a SiON layer as shown in FIGS. 1–3 are expected to contain larger bubble defects, while thinner TEOS layers should have smaller defects. Bubble defects 28 extend as localized voids from the origination point of the bubble to the surface of the TEOS. This extension from an origination point to the TEOS surface is illustrated using dashed lines in FIG. 3. For clarity, the extensions are shown for only a few of the defects. The localized voids may cause electromigration and other reliability issues unless the SiON layer bake recited herein is performed.

Figure 4:
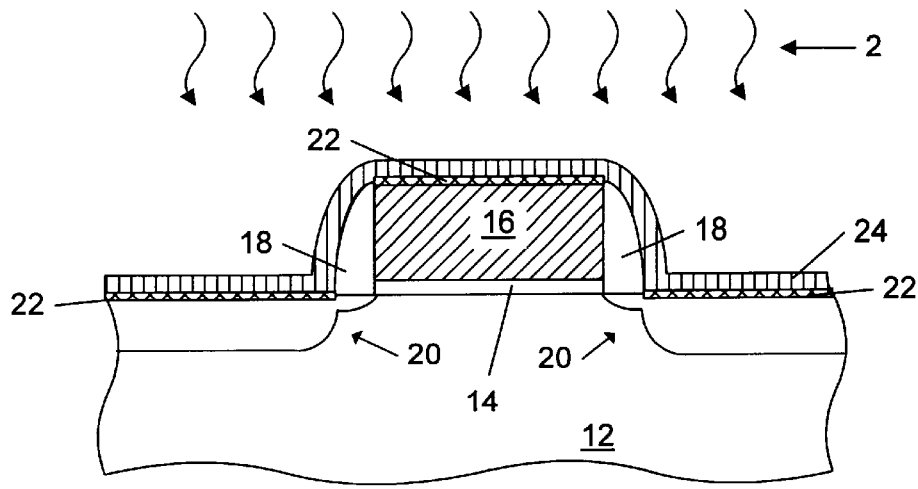
FIG. 4 is a partial cross-sectional view of the semiconductor topography according to the process recited herein, wherein the silicon oxynitride layer is heated prior to deposition of the TEOS layer, subsequent to the silicon oxynitride deposition of FIG. 2.

Turning now to FIG. 4, application of thermal process 2 to SiON layer 24 is shown. Thermal process 2 is applied to the structure as shown in FIG. 2, before the TEOS deposition shown in FIG. 3. Thermal process 2 preferably includes heating the substrate to about 400° C. for about 1 minute. The bake temperature may range from about 350° C. to about 450° C., with a bake time ranging from about 30 seconds to about 2 minutes. Thermal process 2 is preferably performed in an inert gas environment, such as nitrogen or argon. Furthermore, thermal process 2 is preferably an in-situ bake, performed in a heating chamber which is connected to the SiON and TEOS deposition chambers using one or more vacuum valves. In this way, the substrate is not exposed to room air between the SiON and TEOS depositions. Alternatively, the bake could be performed in either the SiON or TEOS deposition chambers by heating the substrate without introducing reactant gases to the chamber. Heating of substrates in deposition chambers is typically minimized to the extent possible, however, because of the possibility of contamination from, for example, particles and flakes of deposited material on the walls of the chamber. Furthermore, the operating hardware and software of typical cluster tool deposition systems is often configured such that an additional heating step at one substrate mounting position must be repeated at all mounting positions. This can result in an increased cycle time for the process.

Figure 5:
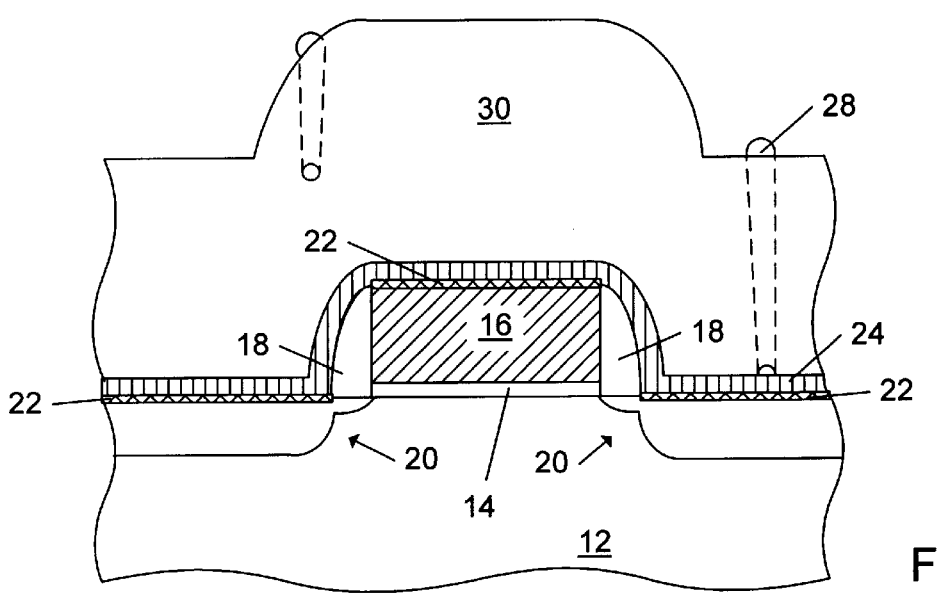
FIG. 5 is a partial cross-sectional view of the semiconductor wherein a TEOS layer is deposited over the baked silicon oxynitride layer, and wherein a greatly reduced number of bubble defects is formed at the upper surface of the TEOS layer, subsequent to the heating of FIG. 4.

Deposition of TEOS layer 30 over the baked SiON layer 24 of FIG. 4, according to the process recited herein, is shown in FIG. 5. TEOS layer 30 is deposited in a similar manner to TEOS layer 26 shown in FIG. 3. TEOS layer 30, however, has a greatly reduced number of bubble defects 28 as compared to TEOS layer 26 of FIG. 3. The reduction of bubble defects shown in FIG. 5 is believed to be a result of thermal process 2 shown in FIG. 4. The heating of SiON layer 24 is believed to greatly reduce outgassing of SiON layer 24 during deposition of TEOS layer 30, and the defect formation which may result from such outgassing.

After formation of the interlevel dielectric as shown in FIG. 5, openings may be etched into the dielectric to allow connection to the source, gate, and/or drain of the transistor. These openings may be filled using, for example, a tungsten plug process in which an adhesion layer is deposited to line the opening and tungsten is then deposited to fill the opening. An overlying interconnect layer may then connect to the tungsten plugs. Alternatively, local interconnects could be formed directly from the tungsten (or other conductor) plug material, by patterning trenches into the interlevel dielectric which are then filled with a process similar to the tungsten plug process described above. Furthermore, instead of being performed directly above a transistor, the process shown in FIGS. 2, 4, and 5 could also be applied to a substrate having one or more interconnect layers previously formed. Openings would then be made in the TEOS/SiON dielectric to allow connections between underlying and overlying layers of interconnect.

Figure 6:
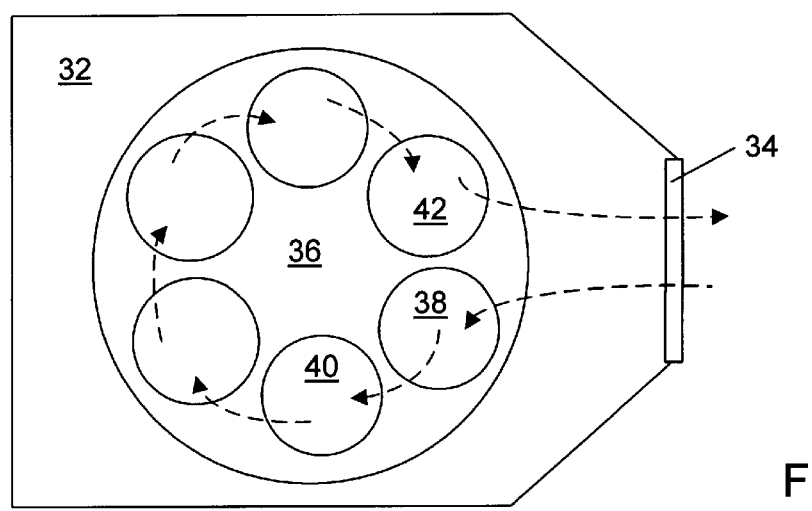
FIG. 6 is a cross-sectional top view showing the substrate mounting position layout of an exemplary deposition system.

Turning now to FIG. 6, a cross-sectional top view of an exemplary deposition chamber 32 is shown. Deposition chambers for the semiconductor industry such as that illustrated in FIG. 6 are manufactured by, for example, Novellus. Valve 34 allows connection of chamber 32 to other chambers to form a cluster tool. Substrate mounting surface 36 includes multiple substrate, or wafer, mounting positions (in this case, six). The dashed-line arrows show the path taken by a substrate entering the chamber for a deposition. A first portion of a deposited layer is formed with the substrate on first mounting position 38. The substrate is then moved to second mounting position 40 for deposition of a second portion of the layer. The process continues on each mounting position until the sixth portion is deposited with the substrate on sixth mounting position 42, and the substrate is then moved out of the deposition chamber. Although the process has been described for one substrate, it should be noted that during typical operation of the deposition system illustrated in FIG. 6, a new substrate is moved onto the first mounting position and a substrate having a complete deposited layer is removed from the chamber after each portion of a deposition. In other words, six substrates may be undergoing deposition simultaneously, each substrate is at a certain deposition position within the chamber and receives a portion of the total deposition amount. Parts of a typical chamber which are not shown in FIG. 6 include a substrate-handling mechanism, substrate heaters, plumbing for delivery of reactant gases, electrodes for plasma generation, and one or more vacuum pumps. Although six substrate mounting positions are shown in the chamber of FIG. 6, a different number of positions could be used.

Figure 7:
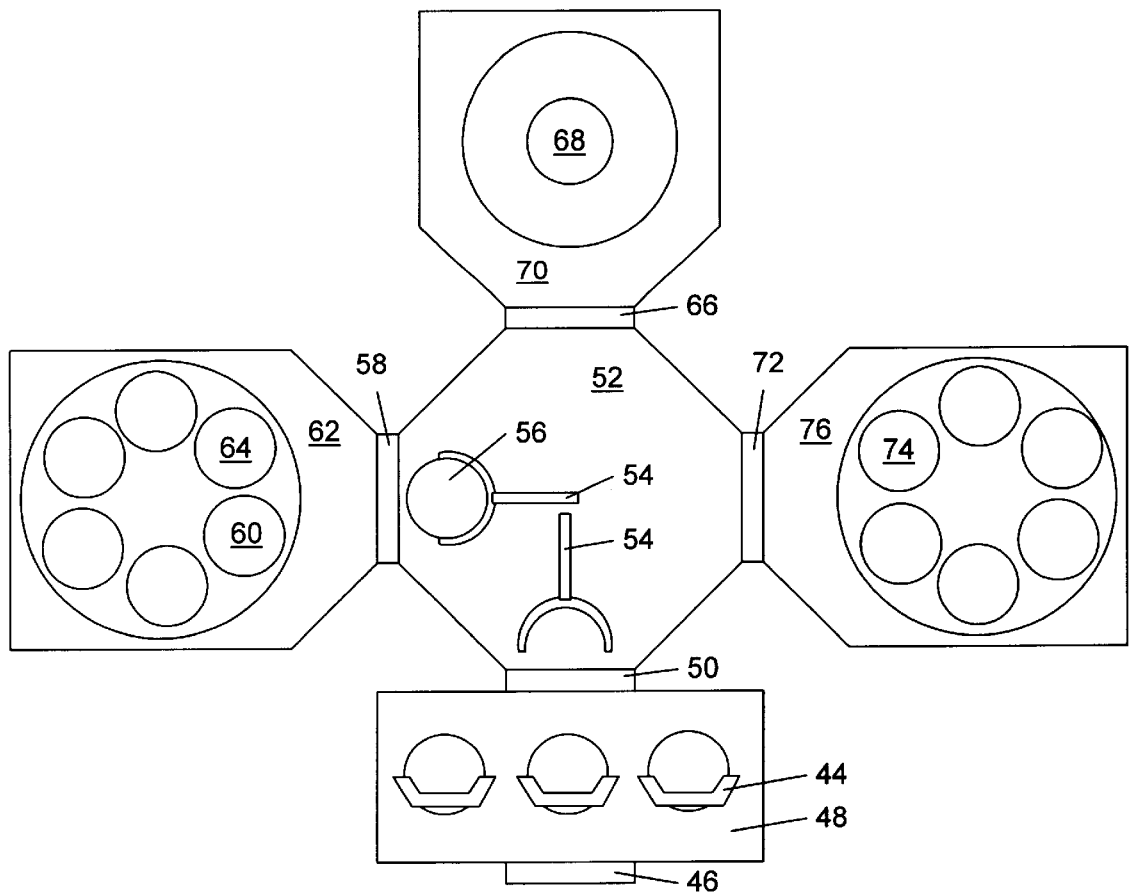
FIG. 7 is a cross-sectional top view showing the layout of an exemplary cluster tool having a SiON deposition chamber, a heating chamber, and a TEOS deposition chamber mutually connected and separate from an outside ambient.

A cross-sectional top view showing an exemplary cluster tool arrangement that might be used for a preferred embodiment of the process of FIGS. 2, 4, and 5 is shown in FIG. 7. A group of substrates is stacked in wafer cassette 44. Cassette 44 is loaded through valve 46 into loadlock/entry chamber 48 of the cluster tool. Valve 50 connects loadlock chamber 48 to transfer chamber 52. Transfer chamber 52 contains one or more substrate manipulators 54 which can remove a substrate from cassette 44 and transfer it to a substrate mounting position in an attached chamber. Although shown here as forks which fit under and/or around a substrate such as substrate 56, a substrate manipulator 54 could take other forms. For example, a vacuum wand which uses a vacuum to grip a substrate might be used. Substrate manipulators 54 are configured for movement in various ways so that substrates may be moved in and out of the attached chambers. Forms of movement employed might include rotation, translation along a track, and telescoping to become longer or shorter.

Figure 8:
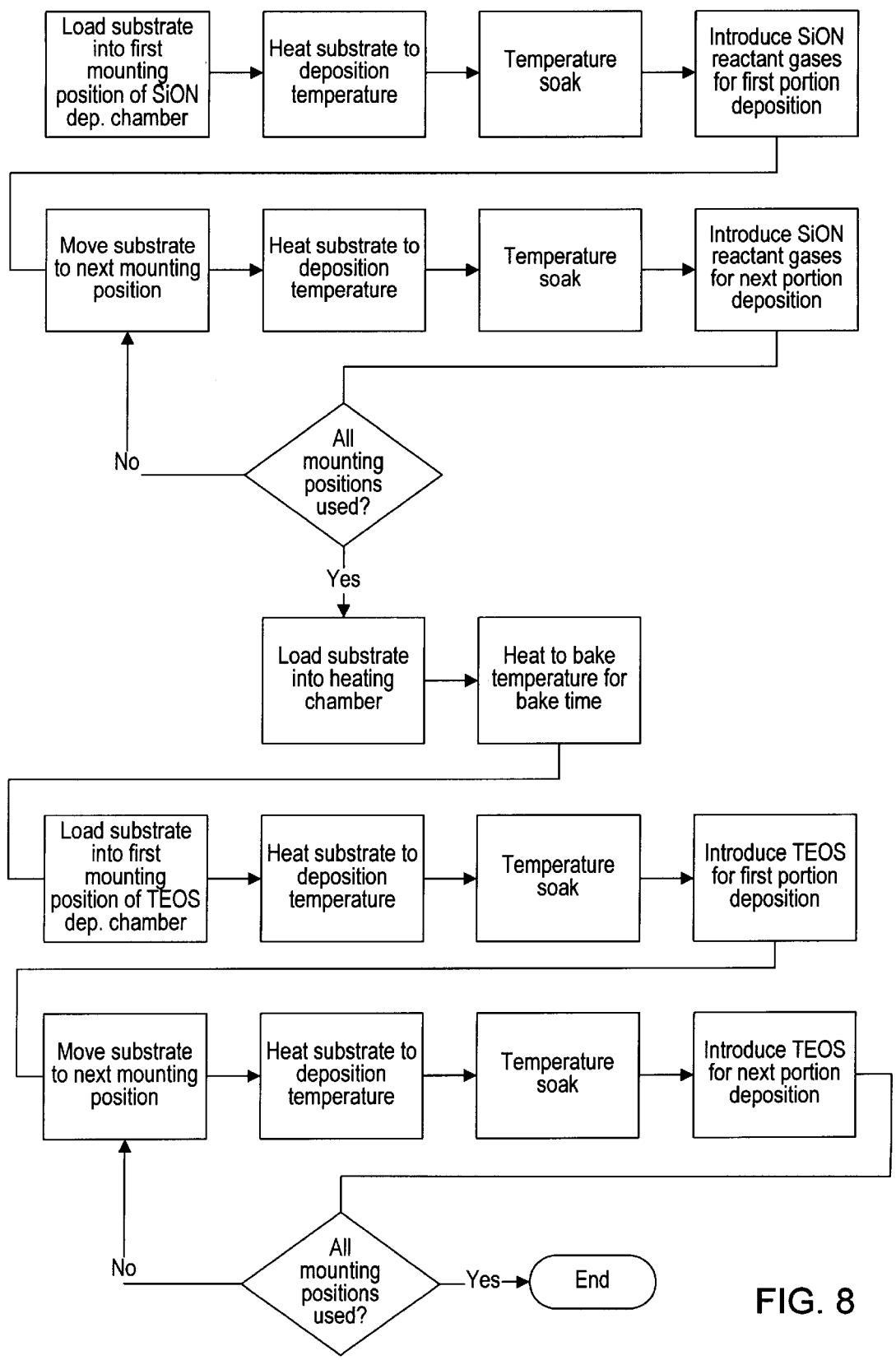
FIG. 8 is a flow diagram of the process sequence for an embodiment of the process recited herein.

A procedure for performing the process recited herein using equipment such as that shown in FIG. 7 is given by the flow diagram of FIG. 8. The procedure of the flow diagram is described here, using reference labels for parts of the equipment shown in FIG. 7. To perform the process recited herein for interlevel dielectric formation on substrate 56, the substrate is loaded through valve 58 onto first substrate mounting position 60 of SiON deposition chamber 62. An SiON layer is then deposited in six portions, by moving the substrate through the chamber as illustrated in FIG. 6. As described in FIG. 8, the substrate is heated to deposition temperature and allowed to stabilize in temperature before reactant gases are introduced. This process is repeated for each portion of the deposition. After deposition of the final portion of the SiON layer in sixth mounting position 64, substrate 56 is moved out of SiON deposition chamber 62.

Substrate 56 is subsequently moved through valve 66 and onto mounting position 68 of heating chamber 70. Substrate 56 is then heated to approximately 400° C. for about 1 minute, as also illustrated in FIG. 4. The heating may be accomplished, for example, by a system of lamps arranged within the chamber so that the substrate is radiatively heated. Lamp heating systems typically provide very rapid (a few seconds) heating and cooling response times. Subsequent to the bake in heating chamber 70, substrate 56 is moved through valve 72 and onto first substrate mounting position 74 of TEOS deposition chamber 76. TEOS deposition proceeds in six portions, in a similar manner as for the SiON deposition. After deposition of the final portion of the TEOS layer, the interlevel dielectric formation process is complete, as indicated in FIG. 8. An etch process may subsequently be performed to form openings in the dielectric layer for connection to underlying transistors or interconnects. The etch process may be performed in an additional chamber connected as a part of the cluster tool of FIG. 7. Alternatively, the substrate may have to be moved to a separate chamber for further processing. As pointed out in discussion of FIG. 6 above, it should be noted that a new substrate is typically introduced into each chamber as soon as the first mounting position becomes unoccupied, so that multiple substrates are moving through the process at any given time. In the event that a process occurring in one chamber takes a different amount of time than a process in a subsequently-used chamber, there may be points in the fabrication sequence at which substrates "pile up" while waiting for available space in a chamber. In this case, substrates may be temporarily stored in, for example, cassettes after exiting one chamber and before entering another. As in the case of FIG. 6, several aspects of an actual cluster tool, including substrate heaters, reactant gas plumbing, electrodes for plasma generation, and vacuum pumps, are not shown in FIG. 7.

It will be appreciated to those skilled in the art having the benefit of this disclosure that this invention is believed to provide a method for forming a TEOS/SiON interlevel dielectric to be used in integrated circuit fabrication. Further modifications and alternative embodiments of various aspects of the invention will be apparent to those skilled in the art in view of this description. For example, equipment other than the cluster tool and deposition chambers described herein could be used in carrying out the process recited herein. Other types of deposition chamber which might be used include horizontal tube LPCVD reactors. Furthermore, the interlevel dielectric formation recited here may be applicable to circuits which do not contain MOS transistors, such as bipolar integrated circuits. It is intended that the following claims be interpreted to embrace all such modifications and changes and, accordingly, the specification and drawings are to be regarded in an illustrative rather than a restrictive sense.

What is claimed is:

1. A method for forming an interlevel dielectric, comprising:

forming a silicon oxynitride layer upon a semiconductor topography;

performing a bake of said silicon oxynitride layer; and forming an oxide layer directly over said silicon oxynitride layer thereby forming the interlevel dielectric, wherein said forming the oxide layer is subsequent to said performing the bake.

2. The method as recited in claim 1, wherein said forming the silicon oxynitride layer further comprises first forming a transistor within said semiconductor topography.

3. The method as recited in claim 2, wherein said forming the transistor comprises:

forming a gate conductor dielectrically spaced above a semiconductor substrate;

forming dielectric spacers on opposed sidewall surfaces of said gate conductor;

introducing dopant impurity distributions self-aligned to said gate conductor and to said sidewall spacers such that a source and a drain are formed; and forming silicide regions on upper surfaces of said gate conductor, source and drain, exclusive of said dielectric spacers.

4. The method as recited in claim 1, wherein said forming the silicon oxynitride layer comprises chemical vapor depositing using a deposition temperature in a range from about 200° C. to about 500° C.

5. The method as recited in claim 4, wherein said chemical vapor depositing comprises reacting silane with a nitrogen-containing chemical and an oxygen-containing chemical.

6. The method as recited in claim 5, wherein said nitrogen-containing chemical comprises nitrogen.

7. The method as recited in claim 5, wherein said oxygen-containing chemical comprises nitrous oxide.

8. The method as recited in claim 4, wherein said chemical vapor depositing comprises:

loading said semiconductor topography into a first substrate mounting position of a deposition chamber having multiple substrate mounting positions;

heating said semiconductor topography until said deposition temperature is maintained to a predetermined degree of accuracy;

introducing reactant gases into said deposition chamber for a predetermined time such that a portion of said silicon oxynitride layer is deposited; and moving said semiconductor topography to an adjacent mounting position in said deposition chamber for deposition of another portion of said silicon oxynitride layer.

9. The method as recited in claim 8, wherein said heating the semiconductor topography comprises increasing a duration of said heating, prior to said introducing reactant gases.

10. The method as recited in claim 1, wherein said performing the bake comprises heating said semiconductor topography using a bake temperature in a range from about 350° C. to about 450° C.

11. The method as recited in claim 10, wherein said heating comprises heating in an inert ambient.

12. The method as recited in claim 11, wherein said heating in an inert ambient comprises heating in a nitrogen ambient.

13. The method as recited in claim 10, wherein said heating comprises:

loading said semiconductor topography into a substrate mounting position of a heating chamber, wherein said heating chamber is connected using one or more vacuum valves to one or more deposition chambers; and heating said semiconductor topography to said bake temperature for a time in the range of about 30 seconds to about 2 minutes.

14. The method as recited in claim 1, wherein said forming the oxide layer comprises decomposing tetraethyl orthosilicate (TEOS) using a deposition temperature in the range from about 300° C. to about 800° C.

15. The method as recited in claim 14, wherein said decomposing comprises:

loading said semiconductor topography into a first substrate mounting position of a deposition chamber having multiple substrate mounting positions;

heating said semiconductor topography until said deposition temperature is maintained to a predetermined degree of accuracy;

introducing said TEOS into said deposition chamber for a predetermined time such that a portion of said oxide layer is deposited; and moving said semiconductor topography to an adjacent mounting position in said deposition chamber for deposition of another portion of said oxide layer.

16. A method for forming an interlevel dielectric, comprising:

loading a semiconductor substrate into a first substrate mounting position of an oxynitride deposition chamber having multiple substrate mounting positions;

heating said semiconductor substrate to a temperature in a range from about 200° C. to about 500° C. until said temperature is maintained to a predetermined degree of accuracy;

introducing reactant gases into said oxynitride deposition chamber for a predetermined time such that a portion of a silicon oxynitride layer is deposited;

sequentially moving said semiconductor substrate to each of remaining mounting positions in said oxynitride deposition chamber for deposition of another portion of said silicon oxynitride layer at each substrate mounting position, such that the complete silicon oxynitride layer is deposited;

subsequently loading said semiconductor substrate into a heating chamber, wherein said heating chamber is connected using one or more vacuum valves to said oxynitride deposition chamber;

heating said semiconductor substrate to a bake temperature in a range from about 350° C. to about 450° C. for a time in the range from about 30 seconds to about 2 minutes;

subsequently loading said semiconductor substrate into a first substrate mounting position of a TEOS deposition chamber having multiple substrate mounting positions, wherein said TEOS deposition chamber is connected using one or more vacuum valves to said oxynitride deposition chamber and said heating chamber;

heating said semiconductor substrate to a TEOS temperature in a range from about 300° C. to about 800° C. until said TEOS temperature is maintained to a predetermined degree of accuracy;

introducing tetraethyl orthosilicate (TEOS) into said deposition chamber for a predetermined time such that a portion of a TEOS oxide layer is deposited directly over said silicon oxynitride layer; and sequentially moving said semiconductor substrate to each of the remaining mounting positions in said TEOS deposition chamber for deposition of another portion of said TEOS oxide layer at each substrate mounting position, such that the complete TEOS oxide layer is deposited directly over the silicon oxynitride layer, thereby forming the interlevel dielectric.

17. The method as recited in claim 16, wherein said providing further comprises first forming a transistor within said semiconductor substrate.

18. The method as recited in claim 16, wherein said introducing reactant gases comprises introducing silane, a nitrogen-containing gas, and an oxygen-containing gas.

* * * * *